(12) United States Patent
Loebl et al.

(10) Patent No.: US 9,155,157 B2
(45) Date of Patent: Oct. 6, 2015

(54) ELECTROLUMINESCENT DEVICE HAVING A VARIABLE COLOR POINT

(75) Inventors: Hans-Peter Loebl, Monschau-Imgenbroich (DE); Volker Van Elsbergen, Aachen (DE); Edward Willem Albert Young, Maastricht (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 762 days.

(21) Appl. No.: 12/374,350

(22) PCT Filed: Aug. 14, 2007

(86) PCT No.: PCT/IB2007/053215
§ 371 (c)(1),
(2), (4) Date: Jan. 19, 2009

(87) PCT Pub. No.: WO2008/020396
PCT Pub. Date: Feb. 21, 2008

(65) Prior Publication Data
US 2009/0273616 A1 Nov. 5, 2009

(30) Foreign Application Priority Data

Aug. 14, 2006 (EP) .................................... 06118897
Oct. 19, 2006 (EP) .................................... 06122549

(51) Int. Cl.
*G09G 5/10* (2006.01)
*H05B 33/14* (2006.01)
*H01L 51/50* (2006.01)
*H01L 27/15* (2006.01)
*H01L 51/52* (2006.01)

(52) U.S. Cl.
CPC ............ *H05B 33/14* (2013.01); *H01L 51/5036* (2013.01); *H01L 27/156* (2013.01); *H01L 51/5278* (2013.01); *H01L 2251/5361* (2013.01)

(58) Field of Classification Search
CPC ........................... H01L 51/056; H01L 51/506
USPC ...................... 345/690; 313/504, 506; 257/79
See application file for complete search history.

(56) References Cited

U.S. PATENT DOCUMENTS 3,869,646 A 3/1975 Kirton et al.
6,069,597 A 5/2000 Hansen
(Continued)

FOREIGN PATENT DOCUMENTS

GB 2410600 A 8/2005
JP 62294280 12/1987
(Continued)

*Primary Examiner* — Towfiq Elahi
(74) *Attorney, Agent, or Firm* — Yuliya Mathis (57) ABSTRACT

An electroluminescent device (9) for emitting light (7) whose color point is able to be set variably, comprising at least two electroluminescent regions (41, 42) that, to allow the same operating voltage to be applied, are arranged to be connected in parallel electrically, wherein the electroluminescent regions (41, 42) comprise—at least one first electroluminescent region (41) of a first electroluminescent material for emitting light in a first spectral band in accordance with a first luminance vs. voltage characteristic (81), and—at least one second electroluminescent region (42) of a second electroluminescent material for emitting light in a second spectral band that is not the same as the first spectral band, in accordance with a second luminance vs. voltage characteristic (82) that is not the same as the first luminance vs. voltage characteristic (81).

1 Claim, 5 Drawing Sheets

(56) References Cited

U.S. PATENT DOCUMENTS

| | | | |
|---|---|---|---|
| 6,515,314 B1 | 2/2003 | Duggal et al. | |
| 6,710,756 B2 * | 3/2004 | Zimlich | 345/75.2 |
| 7,256,427 B2 * | 8/2007 | Daniels | 257/89 |
| 2003/0111533 A1 | 6/2003 | Chang | |
| 2003/0234608 A1 * | 12/2003 | Lee et al. | 313/504 |
| 2004/0096570 A1 | 5/2004 | Weaver et al. | |
| 2004/0161632 A1 | 8/2004 | Seo et al. | |
| 2004/0164671 A1 | 8/2004 | Noguchi | |
| 2004/0246742 A1 * | 12/2004 | Toyota et al. | 362/555 |
| 2005/0110420 A1 * | 5/2005 | Arnold et al. | 315/169.3 |
| 2005/0212728 A1 * | 9/2005 | Miller et al. | 345/76 |
| 2005/0280375 A1 | 12/2005 | Chikugawa et al. | |
| 2006/0017377 A1 * | 1/2006 | Ryu | 313/504 |
| 2006/0221100 A1 * | 10/2006 | Kao et al. | 345/690 |

FOREIGN PATENT DOCUMENTS

| | | |
|---|---|---|
| JP | 2199793 A | 8/1990 |
| JP | 2002198174 A | 7/2002 |
| JP | 2005101660 A | 4/2005 |
| JP | 2006210848 A | 8/2006 |
| RU | 2202843 C2 | 4/2003 |
| WO | 0188990 A | 11/2001 |
| WO | 0199195 A1 | 12/2001 |
| WO | 2005048366 A2 | 5/2005 |

\* cited by examiner

ELECTROLUMINESCENT DEVICE HAVING A VARIABLE COLOR POINT

The invention relates to an electroluminescent device for emitting light, having a variable color point, and to a method of setting and varying the color point.

Electroluminescent devices are used for a large number of applications such for example as room-lighting systems, marking and signaling systems, the back-lighting of displays or screens and many others. They generally comprise an electroluminescent structure in layer form (an EL structure) that is applied to a substrate and that has a light-emitting layer that is arranged between two electrodes for applying an operating voltage. When the applied voltage is above a minimum, the electroluminescent device emits light whose spectrum depends on the properties of the light-emitting material. For some of the applications mentioned, such for example as room-lighting systems, lamps and the back-lighting of screens, it is essential for white light having a given color point to be emitted. White electroluminescent devices can be produced in various ways, such for example as by means of a light-emitting layer composed of a mixture of materials which, when combined into a single layer, emit white light, or by means of a light-emitting layer that emits, for example ultraviolet light, which ultraviolet light is converted by a color-converting layer into white light. Electroluminescent devices of this kind have the disadvantage that the color point of the light cannot be changed. Other electroluminescent devices that do allow the color point of the white light to be varied require costly and complicated control means including feedback loops.

Document US 20030111533 for example discloses an arrangement of red, green and blue-emitting inorganic LEDs where the light emitted by the different colored LEDs is measured by means of sensors and, via analyzing and driver electronics, the individual LEDs of different colors are operated by differing voltages matched to the desired color point. Because the different colored LEDs are individually driven, the electroluminescent devices in question are very complicated to operate as far as driving them is concerned and they are also expensive to produce due to the additional sensing components required, and they are thus undesirable.

As an alternative to electroluminescent devices having inorganic LEDs for setting the color point, document US 20040164671 discloses an organic electroluminescent device for emitting white light where the light-emitting layer comprises regions of different light-emitting materials that are arranged next to one another in the plane of the layer. The voltage required for light emission is applied via a transparent first electrode between the substrate and the light-emitting layer and a reflective second electrode that is applied to the side of the light-emitting layer remote from the substrate. Stable white light is obtained by using chemical or physical etching processes or a masking technique to structure the two electrodes, in the course of the production of the layers, in such a way that the different individual regions of the light-emitting layer can be driven independently of one another and the desired color point can be set for the white light by means of the intensities of the light that is emitted by the different regions in different spectral bands, which intensities can be set independently of one another in this way. As well as the complicated individual driving of the individual light-emitting regions, this design of device also calls for an additional and costly technique for producing the structured electrodes and is therefore likewise undesirable.

It is therefore an object of the present invention to provide an electroluminescent device that is suitable for emitting light having a variable color point, whose driving and production requires little in the way of cost and complication.

This object is achieved by an electroluminescent device for emitting light whose color point is able to be set variably, comprising at least two electroluminescent regions that, to allow the same operating voltage to be applied, are arranged to be connected in parallel electrically, wherein the electroluminescent regions comprise at least one first electroluminescent region of a first electroluminescent material for emitting light in a first spectral band in accordance with a first luminance vs. voltage characteristic, and at least one second electroluminescent region of a second electroluminescent material for emitting light in a second spectral band that is not the same as the first spectral band, in accordance with a second luminance vs. voltage characteristic that is not the same as the first luminance vs. voltage characteristic. What is meant by spectral band in the present case is the spectral intensity distribution of the emitted light. Spectral bands may differ in the wavelength of the emitted light or in their intensity as a function of the given wavelength, which becomes apparent as different color points for the given spectral bands.

The first and second electroluminescent materials emit light when an operating voltage of above a minimum voltage is applied to the electroluminescent material. This minimum voltage is typically a few volts. Above the minimum voltage, current flows through the electroluminescent material and stimulates it to emit light of an intensity (quantity of light quanta) that depends on the amount of current flowing. As well as on intensity, the brightness seen by the viewer also depends on the sensitivity of the eye, which is different for different wavelengths, and this brightness is referred to as luminance (measured in candelas [Cd]). What the term luminance vs. voltage characteristic means in the present case is the amount of light emitted by the region concerned, weighted for the sensitivity of the eye, as a function of the voltage in volts [V] that is applied to the region. Luminance depends on the one hand on the electroluminescent material and the amount of light emitted per unit of current and on the other on the amount of current that flows through the region at a given voltage. Different electroluminescent materials may have different minimum voltages and/or luminance vs. voltage characteristics $L[Cd]=f(U[V])$ of different steepnesses (gradients). Similarly, different electroluminescent materials may have different proportionality relationships between the flow of current and the luminance of the emitted light. The flow of current through an electroluminescent material can be varied in the first and/or second region, regardless of the properties of the electroluminescent materials, by means of additional resistors, e.g. layers of materials of a given electrical resistance between the electrodes and the electroluminescent material. If, therefore, two regions of electroluminescent materials having different luminance vs. voltage characteristics are arranged in an electroluminescent arrangement and these electroluminescent materials are operated by an operating voltage that is above the minimum operating voltages of the electroluminescent materials and that, as a result of all the regions being connected in parallel electrically, is the same for both the electroluminescent materials, then both the electroluminescent materials, and hence both the regions, emit light in different spectral bands of luminances that are, as a rule, different. The relative ratio of the luminances from the first and second regions can be changed by varying the operating voltage.

If, when there is a particular ratio between their areas looking in the direction in which the electroluminescent device emits light, the first and second regions emit light of a given color point at a given voltage, then the color point can be shifted towards the spectral band of the region having the steeper luminance vs. voltage characteristic by increasing the voltage. A shift of the color point in the opposite direction is obtained by reducing the operating voltage. To obtain the desired color point, the operating voltage required for it merely has to be set. If for example the first electroluminescent material emits light in the yellow spectral band and the second electroluminescent material emits light in the blue spectral band, then missing yellow and blue light of the intensities suitable for the purpose produces white light. It for example it is the first region of the first electroluminescent material that has the steeper luminance vs. voltage characteristic, and if the electroluminescent device emits white light at an operating voltage $U_W$, then at operating voltages greater than $U_W$ the electroluminescent device will emit light whose color point is shifted into the yellow, and at operating voltages smaller than $U_W$ the color point of the white light will be shifted into the blue. If the difference between the gradients of the luminance vs. voltage characteristics is the opposite way round, then the behavior obtained is reversed.

At the same operating voltage, the color point depends not only on the luminance vs. voltage characteristics of the electroluminescent materials but also on the ratio of the areas of the first and second regions relative to one another looking in the direction in which the electroluminescent device emits light. If, in the example given above, the total area of all the first regions is smaller in another embodiment than it is in the above example, then the color point of the white light will only shift into the yellow when the operating voltages greater than $U_W$ that are applied are suited to the ratio of the areas. In a corresponding way, white light having a color point that is shifted into the blue can be obtained even at operating voltages that are higher than $U_W$ (but not too high).

As an alternative or in addition to an adjustment of the area ratio between the first and second regions, a change in the flow of current through one of the electroluminescent materials at the same operating voltage would also result in a shift in the color point of the light emitted by the electroluminescent device. This can for example be achieved by means of an additional electrically resistive layer between the electroluminescent material and the adjoining electrode. If for example, with a constant area ratio and a constant operating voltage, it is desired to increase the luminance of the first region relative to that of the second region then, by means of an additional resistive layer, the flow of current through the second material can be reduced and the luminance of the second region relative to that of the first region can thus be reduced and hence the color point can be shifted towards the spectral band of the light emitted by the first region.

Depending on the field of application, it is also possible for other combinations of electroluminescent materials to be used if non-white light is desired for the specific application. The above dependences apply to these combinations of materials in a similar way.

The first and/or second electroluminescent material may, in itself, represent the first and/or second region in this case. In other embodiments, the first and/or second electroluminescent material may be part of one or more electroluminescent light sources that, as a whole, represent the first and/or second region.

In one embodiment of the electroluminescent device, the operating voltage may be varied by means of an operating unit for setting the color point of the light emitted.

In another embodiment, the operating voltage is a pulsed voltage, having a pulse height and a pulse length, for which, by means of the operating unit, the pulse height can be varied to set the color point and the pulse length can be varied to set the luminance of the light, independently of one another. By varying the pulse length, the luminance of all the regions can then be raised by an equal amount. The setting of the pulse length does not affect the color point any more because the emission of the regions relative to one another (and hence the color point) depends only on the voltage value along the current vs. voltage characteristic and thus on the pulse height. The setting of the pulse length increases the luminance of the light emitted by the electroluminescent device because the regions emit for a longer time per cycle, i.e. the time between the pulses when the regions are not emitting becomes shorter. The color point and luminance of the light can thus be set independently of one another with a pulsed operating voltage whose pulse height and pulse length are variable. The shape of the pulses in the pulsed voltage may in this case be square-wave, triangular, sine, sawtooth or any other shape. For any desired shape, what is called the pulse height is the maximum value within a pulse and what is called the pulse length is the length of an equivalent square-wave pulse of the same height as the pulse actually applied and of the same integrated area below the voltage curve.

In a further embodiment, the electroluminescent device also comprises a control unit for storing at least the first and second luminance vs. voltage characteristics and for controlling the operating unit. As well as enabling the operating voltage to be set manually for example (manual setting of the pulse height and pulse length in the case of a pulsed operating voltage), the luminance vs. voltage characteristics for the electroluminescent materials used that are stored in the control unit also enable a desired color point to be set automatically. By way of the luminance vs. voltage characteristics stored in the control unit, it is possible to calculate, by means of the control unit, which values of the operating voltage give, in the light emitted by the electroluminescent device, which relative proportions of the spectral bands emitted by the regions, thus fixing the color point of the light. The control unit then sets the required values for the operating voltage.

In a further embodiment, the first and second electroluminescent materials are arranged next to one another in a layer plane to form an electroluminescent layer. This enables production to be simpler than it is when the electroluminescent materials are in a non-planar arrangement, in that the electroluminescent layer is, for example, applied to a planar, unstructured electrode by a printing or masking technique as materials of alternating compositions. An electroluminescent layer of this kind then also allows further layers to be applied easily, including amongst others the second electrode required to produce the electroluminescence.

In a further embodiment having an electroluminescent layer of this kind, the electroluminescent layer may be arranged between a first electrode and a second electrode and may be covered substantially completely by the two electrodes. In this case, the first and second regions are formed solely by the regions of, respectively, the first and second electroluminescent materials. An operating voltage has to be applied to each electroluminescent material to cause light to be emitted. This is achieved by means of a first and a second electrode that are connected to a voltage supply and between which the electroluminescent material is situated as an electroluminescent layer. To enable all the regions to be operated when electrically connected in parallel, all the first electrodes of all the regions and all the second electrodes of all the regions have to be connected together electrically. The electrical connection of the first and second regions in parallel is achieved in this case by means of the two electrodes that cover all the regions. The cost and complication of production is particularly low with this arrangement because the two electrodes merely have to be deposited as continuous, compact layers. The same voltage is thus applied to all the regions of the electroluminescent materials.

With the electroluminescent device according to the invention it becomes possible for the color point to be set in a variable way without the need for one of the two electrodes to be structured and therefore without any major cost or complication in production. To set the desired color point, it is merely necessary to select the appropriate voltage, which means that the driving circuitry involves very little cost or complication. This voltage may be a d.c. voltage or a pulsed voltage having pulses of any desired shape. White light can easily be produced by selecting suitable electroluminescent materials for the first and second regions. Depending on the field of application it is also possible for other combinations of electroluminescent materials to be used when non-white light is desired for the particular application.

In one embodiment, the first and second electroluminescent materials are organic materials. Organic electroluminescent materials can be produced inexpensively in large areas in any desired shapes, thus enabling the dimensions and outline shapes of the first and second regions to be selected to be of widely differing kinds to suit the field of application.

In an alternative embodiment the first and second electroluminescent materials are inorganic materials, being for example typical materials such as GaN, InGaN, GaAsP or AlGaInN. In a further embodiment the first and second regions comprise one or more inorganic LEDs in which the respective inorganic materials are arranged. These inorganic LEDs are for example commercially available LEDs that, where there are a plurality of LEDs in each individual region, are connected together electrically within an individual region in series or, preferably, in parallel with one another.

In a further embodiment, the electroluminescent device comprises, in addition, at least a third region of a third electroluminescent material for emitting light in a third spectral band at an intensity that follows a third luminance vs. voltage characteristic. In one embodiment, the first material emits light in the red spectral band, the second material emits light in the green spectral band, and the third material emits light in the blue spectral band, whereby white light can be produced by mixing red light, green light and blue light. However, depending on the field of application it is also possible for other combinations of electroluminescent materials to be used when non-white light is desired for the particular application.

The invention also relates to a method of setting the color point of light that is emitted by an electroluminescent device as claimed in claim 1, comprising the following steps:
  application of an operating voltage required to give the desired color point. The variation of the voltage to set the color point may for example be performed manually by means of a rotary switch or electronically by means of an internal or external driving circuit.
In one embodiment, the method also comprises the preceding steps
  selection of the desired color point for the light emitted,
  calculation, by means of a control unit, of the operating voltage required to give the desired color point, by reference to the luminance vs. voltage characteristics stored in the control unit,
  control of the operating unit by the control unit to cause the required operating voltage to be applied.
If, in addition, the lighting unit comprises a control unit for controlling the operating voltage, the values of which latter can be calculated from the desired color point and the luminance vs. voltage characteristics stored in the control unit, all that needs to be done is to select the desired color point, the appropriate values for the operating voltage then being determined by the control unit and the operating unit being driven as appropriate. The input of the desired color point may be performed manually, for example by entering color coordinates or by means of a rotary switch or may for example be preset in the control unit. The values may differ as dictated by the field of application of the electroluminescent device and may be settable in such a way as to be variable when there are changes in the nature of the application.

In a further embodiment of the method, the operating voltage is a pulsed voltage having a pulse height and a pulse length and the method comprises, in addition to the application of pulses of a height required to give the desired color point, the application of pulses of a length required to give light of the desired luminance. By means of the independent setting of pulse height and pulse length it is possible to set not only the color point of the electroluminescent device but also its luminance. This setting may, once again, be performed either manually or electronically.

In a further embodiment, the method comprises the preceding steps
  selection of the desired color point and the desired luminance for the light emitted,
  calculation, by means of a control unit, of the height required for the pulses of the operating voltage to give the desired color point and the length required for the pulses of the operating voltage to give the required luminance, by reference to the current vs. voltage characteristics stored in the control unit,
  control of the operating unit by the control unit to cause the operating voltage having pulses of the required height and length to be applied.
If, in this case too, the electroluminescent device has a control unit for controlling the operating voltage, the values of which latter can be calculated from the desired color point and the luminance vs. voltage characteristics stored in the control unit, all that needs to be done is to select the desired color point, the appropriate values for the operating voltage then being determined by the control unit and the operating unit being driven as appropriate. The pulse length to give the desired intensity may also be calculated and set by the control unit separately from this. The input of the desired color point and the desired luminance (brightness) may be performed manually or electrically or may for example be preset in the control unit. The values may differ as dictated by the field of application of the electroluminescent device and may be settable in such a way as to be variable when there are changes in the nature of the application. By means of pulse-length adjustment, provision may for example be made in the control unit for luminance (brightness) to be held constant when the color point is varied.

These and other aspects of the invention are apparent from and will be elucidated with reference to the embodiments described hereinafter.

Figure 1:
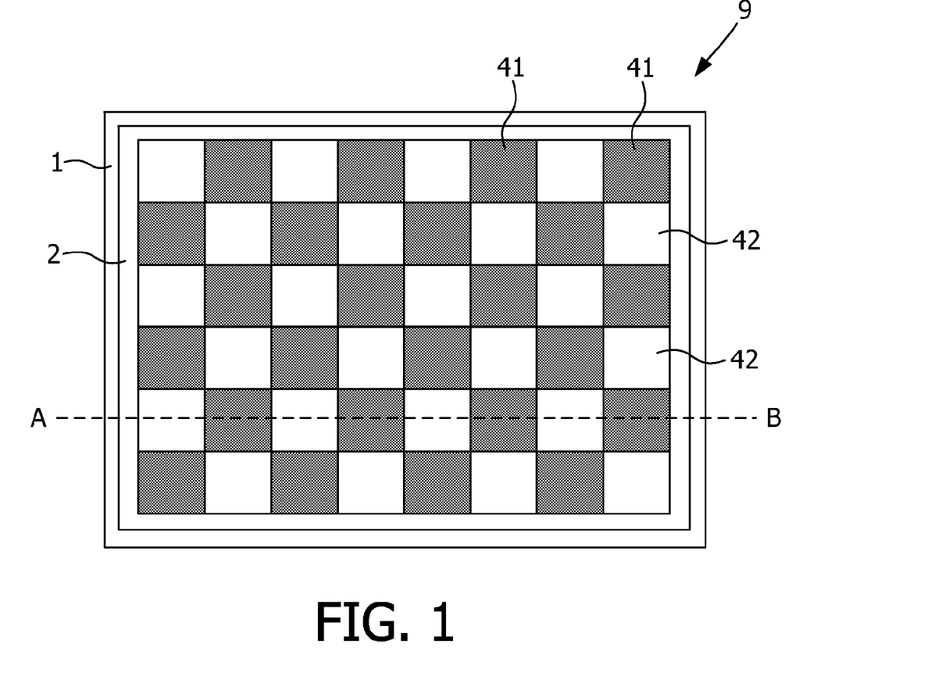
FIG. 1 is a plan view of the embodiment of the electroluminescent device showing the plane of section A-B.
Figure 4:
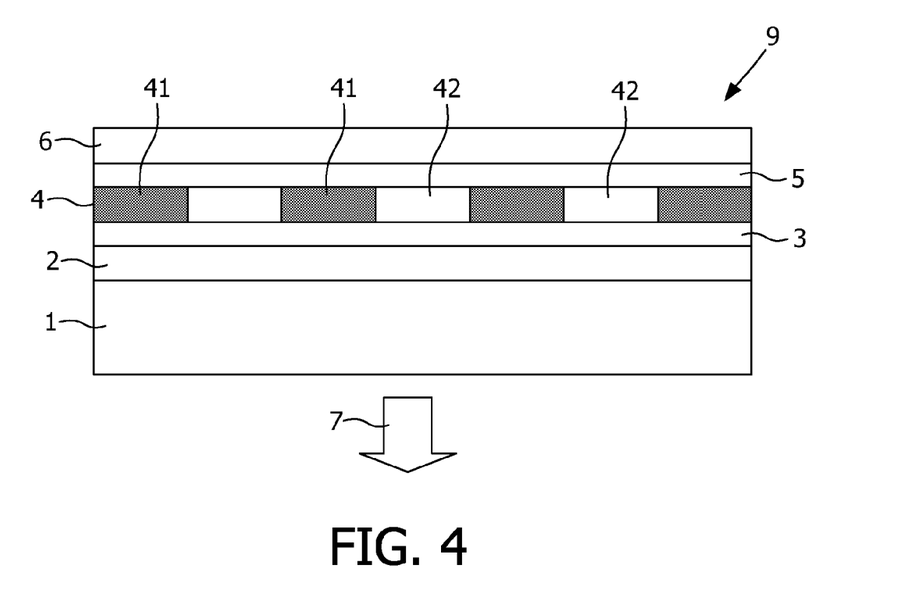
FIG. 4 is a view from the side, in section, of one embodiment of the electroluminescent device according to the invention, on the plane of section A-B shown in FIGS. 1, 2 and 3.

FIG. 1 is a plan view, looking from the side remote from the substrate, of an embodiment of electroluminescent device 9 according to the invention having a substrate 1 and a first electrode 2 and first regions 41 for the emission of light in a first spectral band in accordance with a first luminance vs. voltage characteristic (LVC), and second regions 42 for the emission of light in a second spectral band in accordance with a second luminance vs. voltage characteristic (LVC), which first and second regions 41, 42 are arranged on the first electrode 2. In the direction of viewing (in plan), the second electrode required for the application of the operating voltage would be arranged in front of the first and second regions and for reasons of clarity it has not been shown in FIG. 1. Line A-B indicates the plane of section for the sectional view from the side of the electroluminescent device 9 according to the invention that is shown in FIG. 4.

As an example, the first and second regions 41 and 42 are laid out in a chessboard pattern in FIG. 1. The geometrical layout of the first and second regions may be as desired and is not material to the invention. The first and second regions 41 and 42 may be arranged next to one another in an electroluminescent layer 4, as shown here. They may however also be arranged to be separated from one another in the horizontal direction and also in the vertical direction. The first and second electroluminescent materials in the first and second regions 41 and 42 may be organic or inorganic materials in this case. It is however also possible for the first regions 41 for example to comprise organic material while the second regions 42 comprise inorganic material. If (in contrast to what is shown here) the first and second regions 41 and 42 are not directly adjacent to one another, then the gaps must be filled with a material that is electrically non-conductive, so that no electrical short-circuits can occur between the first electrode 2 and the second electrode (not shown in this case). In this embodiment, the total area as shown in FIG. 1 of all the first regions 41 is the same as the total area of all the second regions 42. The relative sizes may also be selected to be appreciably different to suit the combination of electroluminescent materials that is employed. The ratio of the areas has to be selected in a suitable way by the user against the background of the specific luminance vs. voltage characteristics and the desired field of application (color point) of the electroluminescent device 9. The same is also true of third and any further regions in cases where it is not only first and second electroluminescent materials that are used in the organic electroluminescent layer but also third and further electroluminescent materials.

By mixing, white light can for example be produced from a first region 41 that emits in yellow and a second region 42 that emits in blue. Instead of this, it would also be possible to use three regions, of which the first region emitted blue light, the second region emitted green light and a third region emitted red light. The mixing of the light emitted by the different regions can be improved by suitable diffusing layers that, looking in the direction in which the light is emitted, are arranged above the electroluminescent device, thus producing for the viewer uniform perceived light even at only short distances from the electroluminescent layer. For this purpose, there are a large number of measures described in the prior art for improving the mixing (superimposition) of the light from the different regions, by for example the use of suitable light diffusing layers that, looking in the direction in which the light is emitted, are arranged on the substrate 1 or, in other embodiments, between the substrate 1 and the first electrode 2. To improve the mixing of the light, it is useful for the extent of the individual first and second regions 41 and 42 (and where required of the third and other regions too) to be selected to be sufficiently small in comparison with the total light-emitting area. The term "sufficiently small" also depends on whether, and if so what, additional steps are taken to give improved mixing of the light. The person skilled in the art may select the individual regions to be larger when for example a diffusing layer having pronounced diffusing properties is used at points along the remainder of the beam path. The same considerations also apply to electroluminescent devices 9 that are to emit not white light but light of a different color to give a uniform perceived color, with, at the same time, the possibility of being able to vary the color point.

Figure 2:
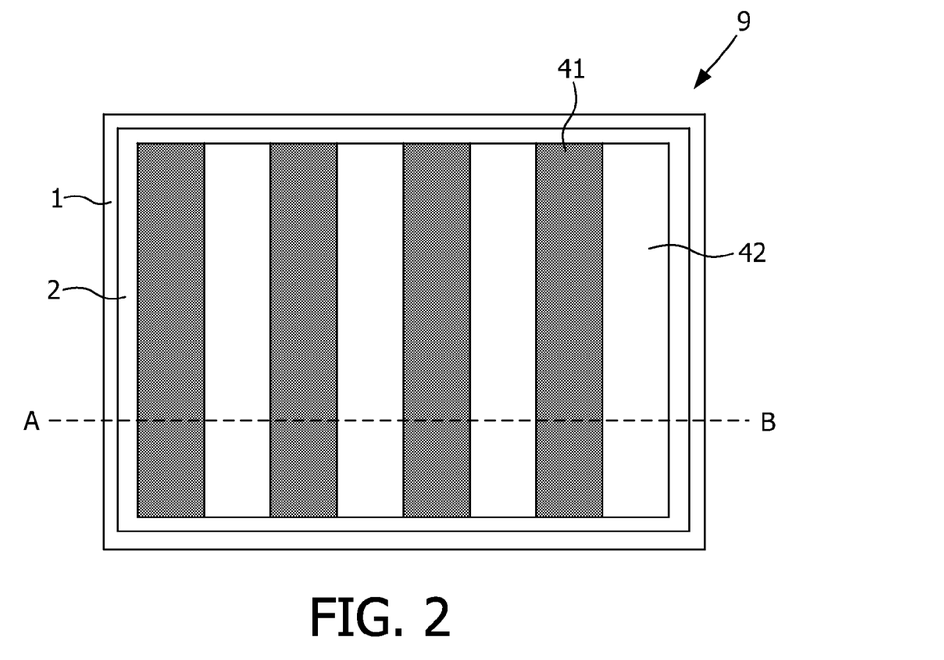
FIG. 2 is a plan view of a further embodiment of the electroluminescent device according to the invention shown in FIG. 1, showing the plane of section A-B.
Figure 3:
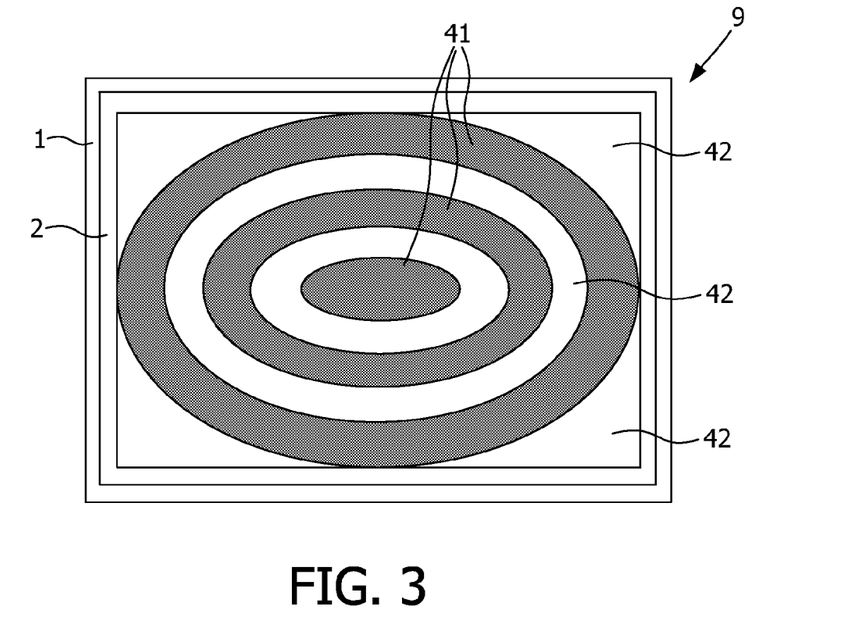
FIG. 3 shows a further embodiment of the electroluminescent device according to the invention.

Diagrammatic plan views of other embodiments of the electroluminescent device 9 are shown in FIG. 2 and FIG. 3. In this case the first and second regions 41 and 42 are laid out not in a chessboard pattern but in stripes (FIG. 3) or in rings (FIG. 4). In this case too, the same variations are possible in connection with the arrangement of the first and second regions 41 and 42 as were explained above in connection with FIG. 1.

By way of example, FIG. 4 is a view from the side, in section on the plane of section A-B indicated in FIG. 1, of an embodiment of electroluminescent device 9 according to the invention having a first electroluminescent material 41 and a second electroluminescent material 42, which materials are arranged next to one another in a layer plane to form an electroluminescent layer 4. The electroluminescent device comprises in this case a substrate 1, a first electrode 2 that is applied to the substrate 1, the electroluminescent layer 4 and a second electrode 6 that is applied to the side of the electroluminescent layer 4 remote from the substrate. In this embodiment, the first electrode 2 is produced in a transparent form, from ITO for example, to be the anode, while the second electrode 6, which forms the cathode, is reflective, being made for example of a metal such as aluminum, which means that the electroluminescent device emits light 7 through the substrate.

In other embodiments, the electrode 2 may be produced to be reflective and the electrode 6 to be transparent, which means that the emission of light would then take place through the electrode 6. In principle, the complete sequence of layers may also be applied in an inverted form so that the electrode 2 acts as a cathode and the electrode 6 as an anode. The hole transporting and electron transporting layers would then also be interchanged in a similar way. These embodiments that represent alternative arrangements of the electrodes 2 and 6 are also possible on electroluminescent devices having regions 41 and 42 of inorganic material.

In accordance with the invention, the organic electroluminescent layer 4 comprises two different organic materials for emitting light in two different spectral bands. In the embodiment shown in FIG. 4, these organic materials are arranged next to one another in the plane of the organic light emitting layer 4 in two different regions 41 and 42. Essential to the invention is the use of different materials, of which the first electroluminescent material, which is arranged in all the first regions 41, has a first current vs. voltage characteristic that is not the same as the second current vs. voltage characteristic of the second electroluminescent material that is arranged in all the second regions 42.

The first and second regions 41 and 42 may, as shown in FIG. 4, be arranged next to one another in direct contact with one another. The structuring of the organic electroluminescent layer may be achieved by normal structuring processes such for example as masking techniques and/or lithographic processes. However, in other embodiments it is also possible for the first and second regions to be arranged to be separated from one another in space, by means for example of a masking technique when the materials are being vapor-deposited or by suitable processes for applying the materials from a suspension such for example as printing processes. To avoid short-circuits between the cathode and anode, the spaces between the first and second regions would then have to be filled, before the second electrode was applied, with a material that, compared with the layer system situated between the electrodes, was a poor conductor, such for example as undoped matrix material such as TCTA.

In one embodiment, an electroluminescent device 9 according to the invention having a glass substrate 1 has a layer structure as shown in FIG. 4 having the first and second regions 41 and 42 arranged next to one another in stripes in a single plane as shown in FIG. 2, with the layers and materials and the relevant layer thicknesses d arranged as follows.

Embodiment

First electrode 2 acting as anode: ITO, d=120 nm

Hole transporting layer 3: α-NPD between the first electrode and the first region, and MTDATA doped with 1% of F4-TCNQ between the first electrode and the second region, d=80 nm for both materials First region 41:

Red-emitting layer: α-NPD doped with 10% of ADSO76, d=17 nm

Green-emitting layer: TCTA doped with 8% of Ir(ppy)$_3$, d=3 nm

Hole-blocking layer: Balq, d=10 nm

Second region 42:

Blue-emitting layer: Idemitsu-Kosan matrix with fluorescent blue emitters, d=30 nm Electron transporting layer 5: Alq$_3$, d=20 nm Electron injection layer: LiF, d=1 nm Second electrode 6 acting as cathode: Al, d=100 nm.

In the above embodiment, the hole transporting layer 3, which extends over both regions in FIG. 4, is of different material in the areas of the first and second regions. In addition to what is shown in FIG. 4, the first region 41 has, on the side on which the cathode 6 is situated, an additional hole blocking layer of Balq. In addition to what is shown in FIG. 4, there is in this case also an electron injection layer of LiF situated between the cathode 6 and the electron transporting layer 5, to improve the charge transport properties. In this embodiment, the first region 41 is not composed of a homogeneous electroluminescent material but comprises a double layer of an electroluminescent material that emits in the red spectral band and an electroluminescent material that emits in the green spectral band. The resulting emission from this first region 41 is in the yellow spectral band. The advantage of this construction for the first region lies in the wider emission spectrum given by the mixing of a red and a green emission spectrum which, together with the second region 42 that emits in the blue spectral band, gives emitted white light having a higher color rendering index than would be the case if a homogenous electroluminescent material emitting in the yellow spectral band had been used for the first region 41. It would also be possible for mixed electroluminescent materials composed of two or more materials having different emission spectrums to be used in each region. All that is essential is the luminance vs. voltage characteristic different from that of the other light-emitting region.

What may alternatively be used as a blue-emitting material is a double layer comprising 10 nm of Spiro-TAD(2,2',7,7'-tetrakis(diphenylamino)spiro-9,9'-bifluorene) and 20 nm of Spiro-DBVBi(2,2',7,7'-tetrakis(diphenylvinyl)spiro-9,9'-bifluorene). What may be used as an alternative to a red/green double emitting layer is a yellow-emitting electroluminescent material such for example as α-NPD doped with 4% of rubene, or any other known fluorescent or phosphorescent electroluminescent material.

Figure 5:
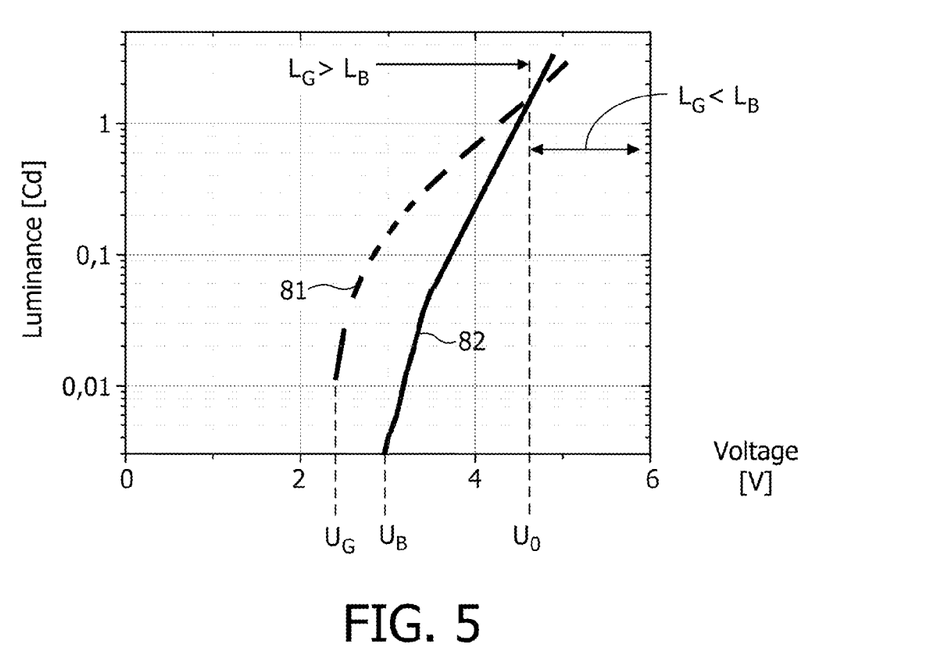
FIG. 5 shows luminance vs. voltage characteristics of first and second regions in a luminance vs. voltage graph in which voltage V is plotted along the X axis and luminance L is plotted along the Y axis.

For the previous embodiment, FIG. 5 shows the corresponding different luminance vs. voltage characteristics (LVCs) that were measured at the electroluminescent device 9. The measurement of luminance to determine luminance in [Cd/m$^2$] is a widely used method of measurement and was carried out in the present case with an LMT L 1009 (made by Lichtmesstechnik GmbH of Berlin). What were measured in this case were the first luminance vs. voltage characteristic 81 for the first region 41, which emits in the yellow spectral band (first spectral band) as a result of the mixing of red and green emissions, and the second luminance vs. voltage characteristic 82 for the second range 42 for emitting light in the blue spectral band (the second spectral band). What is plotted here in the case of the LVC is the luminance L of a region of the electroluminescent device as a function of the voltage V that is applied to this region as an operating voltage. The minimum voltage from which a current flow through the electroluminescent material of the electroluminescent layer 4, and hence the emission of light, begins is shown for the first LVC 81 as $U_G$ and for the second LVC 82 as $U_B$. The first LVC 81 has a lower minimum voltage $U_G<U_B$ from which light emission takes place than the second LVC 82, but above the minimum voltage $U_B$ for the second electroluminescent material, it is less steep than the second LVC 82. Because the emission of light from the yellow-emitting region 41 begins at a minimum voltage $U_G<U_B$, the luminance of the yellow light from the first region predominates up to the voltage $U_0$ at which the two luminance vs. voltage characteristics intersect. The luminance of a region was determined in the present case for the total areas, looking in the direction in which the electroluminescent device emits light, that were selected in the case of the present embodiment, which were in this case 200 cm$^2$ for the first regions and 10 cm$^2$ for the second regions. For other combinations of materials, or other fields of application where other color points are desired, the LVC curves can be shifted relative to one another, by means of a ratio between the sizes of the emitting areas that is adapted to be different in the appropriate way, in such way that the LVC curves intersect at different voltages or do not intersect at all. These dependences in principle apply to both organic and inorganic electroluminescent materials. To allow white light to be obtained from this embodiment at normal voltages, the width of the stripes in the arrangement where the first and second regions are arranged in stripes was selected to differ in such way that the first regions had a total area, looking in the direction in which the electroluminescent device emits light, of 200 cm² and the second regions had a total area of 10 cm².

If for example the electroluminescent device 9 is operated at a voltage $U_1$, where $U_G<U_1<U_0$, then the yellow-emitting region 41 as a whole emits light of a luminance $L_G>L_B$. The light emitted by the electroluminescent device 9 at an operating voltage$<U_0$ thus has a color point that is shifted into the yellow spectral band. At the operating voltage $U_0$ the luminances of the two regions are the same and the electroluminescent device emits white light. What is obtained at operating voltages higher than $U_0$ is, due to the lesser steepness of LVC 81 compared with LVC 82, the corresponding opposite situation. If for example the electroluminescent device is operated at a voltage $U_2>U_0$, then the blue-emitting region 42, as a whole, emits light of a luminance LB>$L_G$. The color point of the light emitted by the electroluminescent device has thus been shifted into the blue spectral band. By varying the operating voltage between $U_1$ and $U_2$, the color point of this organic electroluminescent device can shifted from a yellowish through white light to a bluish light. For other emitter materials, dependences similar to those shown in FIG. 5 can be set by making a suitable adjustment to the light-emitting areas and the electrical resistances along the layer system made up of the individual regions between the electrodes, which means that the pattern of behavior described above will also apply to red and green emitter materials or materials that emit in other colors.

In the case of an electroluminescent device 9 according to the invention having more than two regions composed of different electroluminescent materials that emit light in different spectral bands, the color point of the emitted light can be set in a similar way. When for example there are three electroluminescent materials, which are applied in three regions, then there are three current vs. voltage characteristics that have to be positioned in relation to one another, which gives a wider variety of possible color points. When the color point is varied, it shifts within the color triangle along a line that is dependent on the electroluminescent materials.

Figure 6:
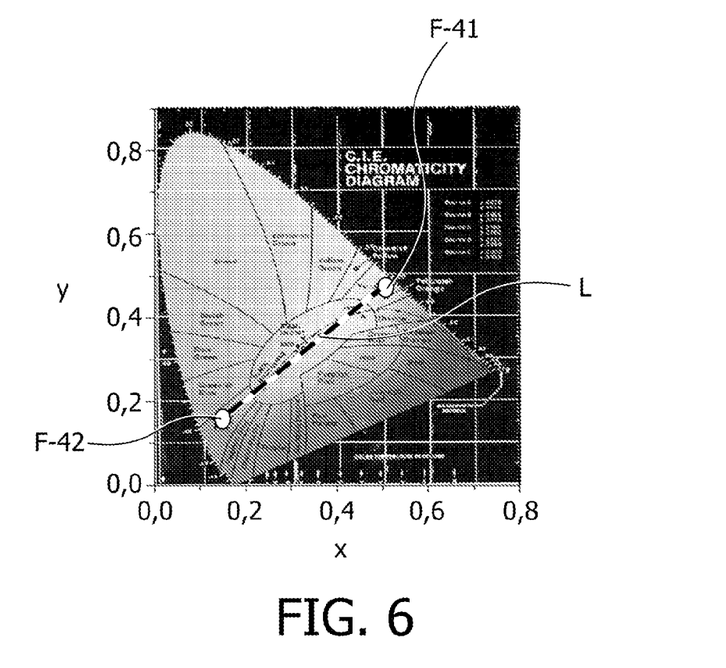
FIG. 6 shows a variation that is possible in the color point by means of an electroluminescent device according to the specified embodiment.

FIG. 6 shows the C.I.E. chromacity diagram with, entered in it, the color points F-41 and F-42 for the first and second regions 41 and 42 in the embodiment discussed above, and a line L along which the color point of the light emitted by the electroluminescent device 9 according to the invention can be shifted by varying the operating voltage.

Figure 7:
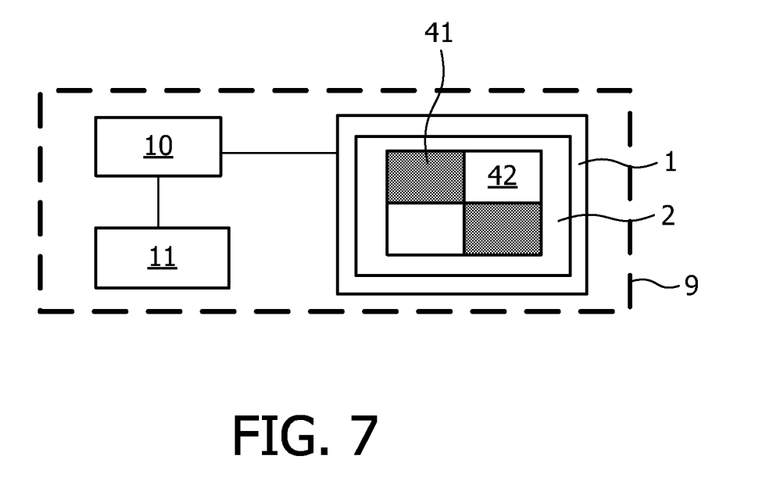
FIG. 7 shows an embodiment of an electroluminescent device according to the invention having an operating unit and a control unit.

FIG. 7 shows an electroluminescent device 9, which comprises an operating unit 10 for applying the operating voltage and a control unit 11 for controlling the operating unit and hence the operating voltage and for storing the luminance vs. voltage characteristics of the regions composed of electroluminescent material for the purpose of setting a desired color point for the light emitted by the electroluminescent device 9. As well as enabling the operating voltage to be set manually for example, the current vs. voltage characteristics that are stored in a control unit 11 for the materials used also enable a desired color point to be set automatically. By means of the luminance vs. voltage characteristics, it can be calculated what voltage values give which relative proportions of the spectral bands emitted by the regions 41 and 42 in the light emitted by the electroluminescent device 9, whereby the color point of the light is fixed. The control unit 11 then sets the values required for the operating voltage that is then applied by the operating unit 10 to the regions 41 and 42. The control unit can also be used to compensate for ageing-related and/or temperature-related effects (measurable by a temperature sensor situated in the vicinity of the electroluminescent layer or incorporated in the electroluminescent layer) and the possible changes that these may cause in the luminance vs. voltage characteristics. A known ageing characteristic curve can be corrected for, via the time in operation (measurable by an internal timer), by means of a stored compensating table. Similarly, an internal measurement of current at a given voltage can be used, by way of a comparison with current values at the beginning of the time in operation, to compensate for changes in the luminance vs. voltage characteristics due to ageing-related and/or temperature-related effects. The luminance vs. voltage characteristics, as corrected for the particular operating conditions (time in operation, operating temperature), can then be used to set the color point.

If what is used as the operating voltage is a pulsed voltage (see FIG. 8), then the desired luminance (brightness) can be calculated and set by the control unit 11 by means of the length 13 of the pulses in the pulsed operating voltage 14, 15. As well as being set manually, the desired color point and the desired brightness may also be set electrically by means of the control unit 11 or may for example be preset in the control unit 11. The values may be different depending on the field of application of the electroluminescent device 9 and they may be settable in such a way as to be variable when there are changes in the nature of the application. By means of an adjustment of pulse length, the control unit 11 may for example be intended to keep the intensity constant when the color point is varied.

Figure 8:
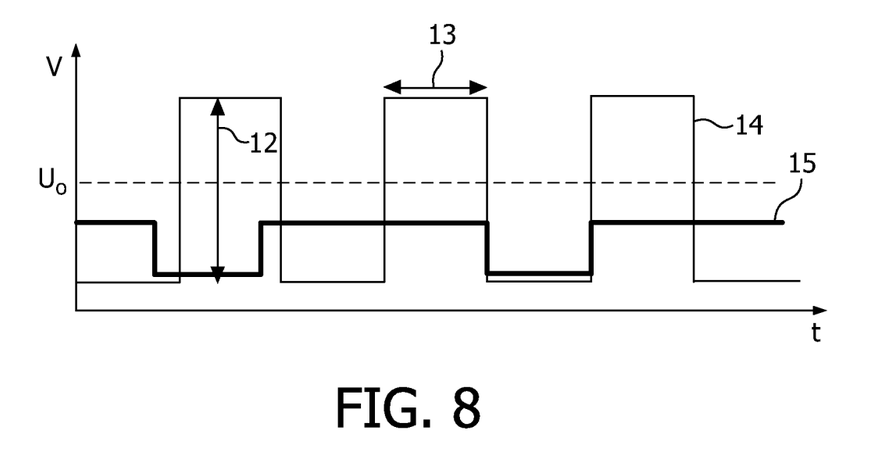
FIG. 8 shows two different pulse shapes for the pulsed operating voltage (V), plotted against time (t).

FIG. 8 shows, schematically, two examples of a pulsed operating voltage that, by means of the operating unit 10, can be applied to the regions as an alternative to a d.c. voltage. This pulsed voltage may have pulses of various shapes such for example as square-wave pulses, triangular pulses, sine pulses, sawtooth pulses or pulses of some other shape. For any desired shape, what is called the pulse height is the maximum value within a pulse and what is called the pulse length is the length of an equivalent square-wave pulse of the same height as the pulse actually applied and of the same integrated area below the voltage curve. What are shown in the case of the embodiment illustrated in FIG. 7 are two different square-wave voltages 14, 15. By means of the pulse height 12, the relative proportions of the spectral ranges of the light emitted by the first and second (and any further) regions 41 and 42 in the light 7 emitted by the electroluminescent device 9 are set, and hence the color point of the light 7 is determined. The overall brightness of the electroluminescent device 9 is varied by means of the pulse length 13, independently of the setting of the color point. For the same electroluminescent device 9, the square-wave operating voltages 14 and 15 thus cause light 7 to be emitted with different color points (different pulse heights 12) and different luminances (pulse lengths 13), which can be set independently of one another. The values of the color point and brightness of the emitted light 7 from the electroluminescent device concerned depend on the electroluminescent materials used for the regions 41 and 42 and the corresponding luminance vs. voltage characteristics 81 and 82.

Figure 9:
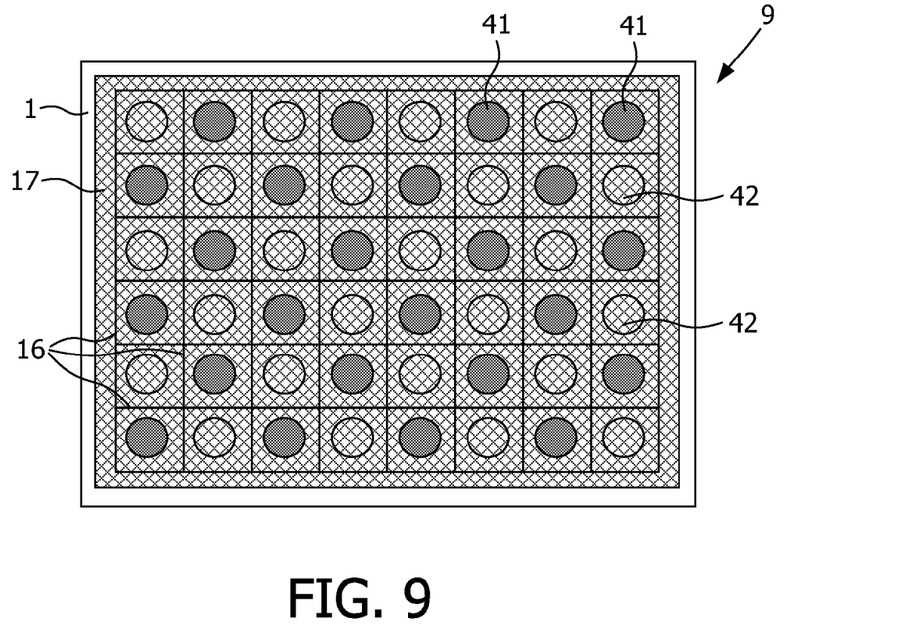
FIG. 9 is a plan view of a further embodiment of an electroluminescent device having inorganic LEDs forming the first and second regions.

FIG. 9 shows a further embodiment of the electroluminescent device 9 according to the invention. In this case the first and second regions 41 and 42 comprise inorganic LEDs that are electrically connected in parallel. The LEDs in the first regions 41 emit yellow light for example and the LEDs in the second regions blue light, but if other inorganic LEDs were selected the first and second regions could for example also emit red or green light or light of some other color. Because the LEDs comprise inorganic electroluminescent materials, the dependences described above also apply in the present case. The LEDs may for example be arranged to be separated from one another optically by reflective and/or non-reflective walls 16. The arrangement in matrix form in FIG. 9 is only one example of a possible arrangement. A number of LEDs may also be arranged in an arrangement different than a matrix. Because LEDs are typically point light-sources, it is advantageous, for the purposes of a uniform perceived brightness over the whole of the light-emitting area of the electroluminescent device according to the invention, if a light-diffusing layer 17, such as a diffuser sheet, is situated in the beam path of the emitted light 7.

Figure 10:
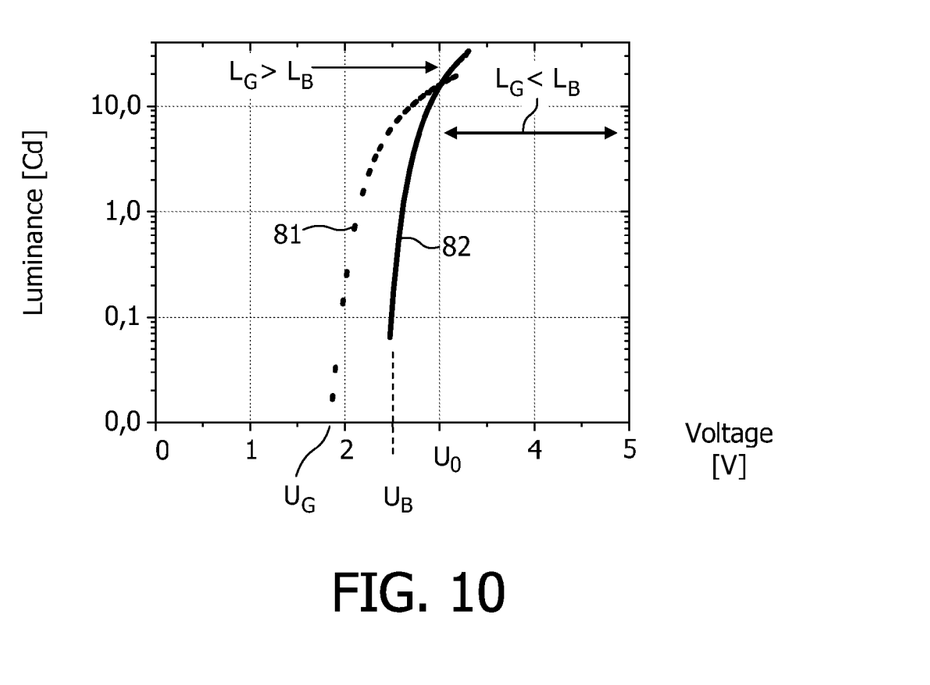
FIG. 10 shows luminance vs. voltage characteristics of two different inorganic LEDs in the embodiment shown in FIG. 9, in a luminance vs. voltage graph in which voltage V is plotted along the X axis and luminance L is plotted along the Y axis.

Taking red-emitting and blue-emitting first and second regions 41 and 42 as examples, FIG. 10 shows, for inorganic electroluminescent materials, the corresponding luminance vs. voltage characteristic 81 (LVC) for the first region 41 and the corresponding luminance vs. voltage characteristic 82 (LVC) for the second region 42, the curves for which characteristics are similar to those shown for the first and second regions in FIG. 5 when organic electroluminescent materials are used. The first and second regions according to the invention in the embodiment shown in FIG. 9 are formed in the present case by commercially available inorganic LEDs having luminance vs. voltage characteristics (LVC's) corresponding to those shown in FIG. 10, namely LSV 81 for a red-emitting LUXEON 1W, LXHL-PD01 made by the Lumileds company, which uses InGaP as an electroluminescent material, and LVC 82 for a blue-emitting LUXEON 1W, LXHL-PB01 made by Lumileds, which uses InGaN as an electroluminescent material.

The embodiments that have been elucidated by reference to the drawings and in the description are only examples of an electroluminescent device according to the invention for emitting light having a variable color point, whose driving and production requires little in the way of cost and complication, and are not to be construed as limiting the claims to these examples. Alternative embodiments are also conceivable by the person skilled in the art, and these too are covered by the scope of the claims.

The invention claimed is:

1. An electroluminescent device for emitting light having a variable color point, the device comprising:
   at least two electroluminescent regions electrically connected in parallel to a transparent electrode and a reflective electrode;
   said at least two electroluminescent regions including:
      at least one first electroluminescent region including a first electroluminescent material for emitting light in a first spectral band in accordance with a first luminance vs. voltage characteristic, and
      at least one second electroluminescent region including a second electroluminescent material for emitting light in a second spectral band different from said first spectral band in accordance with a second luminance vs. voltage characteristic different from said first luminance vs. voltage characteristic,
      an electron transport layer between said transparent electrode and said at least two electroluminescent regions;
   a hole transport layer adjacent said reflective electrode, said hole transport layer including a first material adjacent said first electroluminescent material and a second material different than said first material adjacent said second electroluminescent material;
   wherein an operating voltage is a pulsed voltage having an independently varied pulse height and a pulse length;
   wherein said operating voltage is controlled by an operating unit for setting the color point of the light;
   said operating unit configured to vary
   (i) the pulse height to set the color point, and
   (ii) the pulse length to set the luminance of the light;
   wherein the electroluminescent device also comprises a control unit for storing at least the first and second luminance vs. voltage characteristics and for controlling the operating unit;
   the first and second electroluminescent materials arranged next to one another in a layer plane to form an electroluminescent layer.

\* \* \* \* \*